(12) United States Patent
Kim et al.

(10) Patent No.: US 9,886,997 B2
(45) Date of Patent: Feb. 6, 2018

(54) SEMICONDUCTOR DEVICE FOR REDUCING AN INSTANTANEOUS VOLTAGE DROP

(71) Applicant: SAMSUNG ELECTRONICS CO., LTD., Suwon-si, Gyeonggi-do (KR)

(72) Inventors: Tae Hyung Kim, Hwaseong-si (KR); Sang Yeop Baeck, Hwaseong-si (KR); Jae Young Kim, Hwaseong-si (KR); Jin Sung Kim, Seoul (KR)

(73) Assignee: SAMSUNG ELECTRONICS CO., LTD., Suwon-si, Gyeonnggi-Do (KR)

( * ) Notice: Subject to any disclaimer, the term of this patent is extended or adjusted under 35 U.S.C. 154(b) by 0 days.

(21) Appl. No.: 15/467,230

(22) Filed: Mar. 23, 2017

(65) Prior Publication Data
US 2017/0194041 A1 Jul. 6, 2017

Related U.S. Application Data

(63) Continuation of application No. 14/978,904, filed on Dec. 22, 2015, now Pat. No. 9,627,037.

(30) Foreign Application Priority Data

Dec. 24, 2014 (KR) .................. 10-2014-0188844

(51) Int. Cl.
*G11C 11/413* (2006.01)
*G11C 7/12* (2006.01)
*G11C 8/10* (2006.01)
*G11C 5/06* (2006.01)
*H01L 23/528* (2006.01)
(Continued)

(52) U.S. Cl.
CPC ............ *G11C 11/413* (2013.01); *G11C 5/063* (2013.01); *G11C 7/12* (2013.01); *G11C 8/10* (2013.01); *H01L 23/5286* (2013.01); *H01L 27/0207* (2013.01); *H01L 27/092* (2013.01); *H01L 27/1104* (2013.01)

(58) Field of Classification Search
CPC ....... G11C 11/413; G11C 11/417; G11C 7/12; G11C 5/14; G11C 7/065; G11C 5/063; H01L 27/088; H01L 27/0207; H01L 27/092; H01L 23/5286; H01L 27/1104; H01L 2924/0002
See application file for complete search history.

(56) References Cited

U.S. PATENT DOCUMENTS 7,087,942 B2 8/2006 Osada et al.
2002/0057588 A1 5/2002 Lee et al.
(Continued)

OTHER PUBLICATIONS

U.S. OA dated Jun. 17, 2016 in related U.S. Appl. No. 14/978,904.

*Primary Examiner* — Harry W Byrne
*Assistant Examiner* — Ajay Ojha
(74) *Attorney, Agent, or Firm* — F. Chau & Associates, LLC

(57) ABSTRACT

A semiconductor device for reducing an instantaneous voltage drop is provided. The semiconductor device includes a first power line configured to provide a first power supply voltage and a first power transistor connected between the first power line and a first logic transistor. The first power transistor includes a first source or drain connected to the first power line, a gate receiving a power gating control signal, and a second source or drain connected to a first source or drain of the first logic transistor using a shared semiconductor junction.

20 Claims, 12 Drawing Sheets

(51) Int. Cl.
*H01L 27/02* (2006.01)
*H01L 27/092* (2006.01)
*H01L 27/11* (2006.01)

(56) References Cited

U.S. PATENT DOCUMENTS

| | | |
|---|---|---|
| 2005/0029597 A1 | 2/2005 | Worley |
| 2010/0052775 A1 | 3/2010 | Mizuno et al. |
| 2012/0294102 A1 | 11/2012 | Ishizu |
| 2016/0189759 A1 | 6/2016 | Kim et al. |

SEMICONDUCTOR DEVICE FOR REDUCING AN INSTANTANEOUS VOLTAGE DROP

CROSS-REFERENCE TO RELATED APPLICATIONS

This application is a continuation application of co-pending U.S. application Ser. No. 14/978,904, filed on Dec. 22, 2015, which claims priority under 35 U.S.C. §119 from Korean Patent Application No. 10-2014-0188844, filed on Dec. 24, 2014, in the Korean Intellectual Property Office (KIPO), the disclosures of which are incorporated by reference herein in their entireties.

TECHNICAL FIELD

Exemplary embodiments of the present inventive concept relate to a semiconductor device, and more particularly, to a semiconductor device for reducing an instantaneous voltage drop.

DISCUSSION OF THE RELATED ART

A power gating scheme may be used to reduce power consumption of an electronic device. In the power gating scheme, the electronic device is divided into a plurality of power blocks and the power on or off operations thereof is managed by a unit of each power block. For example, a power block that is not being used may be turned off for reducing overall power consumption of the electronic device.

SUMMARY

According to an exemplary embodiment of the present inventive concept, a semiconductor device is provided. The semiconductor device includes a first power line, a first power transistor, and a first logic transistor. The first power line is configured to provide a first power supply voltage. The first power transistor connected between the first power line and the first logic transistor. The first power transistor includes a first source or drain connected to the first power line, a second source or drain connected to a first source or drain of the first logic transistor using a shared semiconductor junction, and a gate receiving a power gating control signal.

The first source or drain and the second source or drain of the first power transistor may be placed in parallel with each other and may be spaced apart from each other. At least part of the first source or drain of the first logic transistor may be placed in common with at least part of the second source or drain of the first power transistor. A second source or drain of the first logic transistor may be placed in parallel with each other and may be spaced apart from the first source or drain of the first logic transistor. The gate of the first power transistor may be placed between the first source or drain and the second source or drain of the first power transistor. A gate of the first logic transistor may be placed between the first source or drain and the second source or drain of the first logic transistor.

A size of the first power transistor may be at least twofold of that of the first logic transistor.

The semiconductor device may further include a second power transistor connected in parallel with the first power transistor.

The semiconductor device may further include a second power transistor connected between a second power line and a second logic transistor. The second power transistor may include a first source or drain connected to the second power line and a second source or drain connected to a first source or drain of the second logic transistor using a shared semiconductor junction.

The first power transistor may be a P-channel metal-oxide semiconductor (PMOS) transistor, and the second power transistor may be an N-channel metal-oxide semiconductor (NMOS) transistor.

According to an exemplary embodiment of the present inventive concept, a memory device is provided. The memory device includes a memory cell, a first precharge circuit, and a first power switch circuit. The memory cell is connected to a first bit line pair. The first precharge circuit is configured to precharge the first bit line pair. The first power switch circuit comprising a first power transmitter selectively supplying or cutting off a power supply voltage to the first precharge circuit. The first power transmitter includes a first source or drain to which the power supply voltage is applied, a second source or drain connected to a first source or drain of a first precharge transistor in the first precharge circuit using a shared semiconductor junction, and a gate receiving a power gating control signal.

The first bit line pair may include a bit line and a bit-bar line. The first precharge circuit may include the first precharge transistor, a second precharge transistor, and a third precharge transistor. The first precharge transistor may be configured to apply a precharge voltage to the bit line. The second precharge transistor may be connected between the bit line and the bit-bar line. A voltage of the bit line may be equal to a voltage of the bit-bar line. The third precharge transistor may be configured to apply the precharge voltage to the bit-bar line.

The first source or drain and the second source or drain of the first power transistor may be placed in parallel with each other and may be spaced apart from each other. At least part of the first source or drain of the first precharge transistor may be placed in common with at least part of the second source or drain of the first power transistor. A second source or drain of the first precharge transistor may be placed in parallel with and spaced apart from the first source or drain of the first precharge transistor. A gate of the first power transistor may be placed between the first source or drain and the second source or drain of the first power transistor. A gate of the first precharge transistor may be placed between the first source or drain and the second source or drain of the first precharge transistor.

The first power switch circuit may further include a second power transistor. The second power transistor may include a first source or drain to which the power supply voltage is applied, a second source or drain connected to a first source or drain of the third precharge transistor using a shared semiconductor junction, and a gate configured to receive the power gating control signal.

The first source or drain and the second source or drain of the second power transistor may be placed in parallel with each other and are spaced apart from each other. At least part of the first source or drain of the third precharge transistor may be placed in common with at least part of the second source or drain of the second power transistor. A second source or drain of the third precharge transistor may be placed in parallel with and spaced apart from the first source or drain of the third precharge transistor. A gate of the second power transistor may be placed between the first source or drain and the second source or drain of the second power transistor. A gate of the third precharge transistor is placed between the first source or drain and the second source or drain of the third precharge transistor.

The second source or drain of the first precharge transistor may be placed in common with a first source or drain of the second precharge transistor. The second source or drain of the third precharge transistor may be placed in common with a second source or drain of the second precharge transistor.

Each of the first and second power transistors may be a P-channel metal-oxide semiconductor (PMOS) transistor.

A size of each of the first and second power transistors may be at least twofold of that of each of the first through third precharge transistors.

The first precharge circuit may further include a fourth precharge transistor and a fifth precharge transistor. The fourth precharge transistor may apply the precharge voltage to the bit-bar line. The fifth precharge transistor may apply the precharge voltage to the bit line. A first source or drain of the fourth precharge transistor may be commonly connected to the bit-bar line and a gate of the fifth precharge transistor. A second source or drain of the fifth precharge transistor may be commonly connected to the bit line and a gate of the fourth precharge transistor.

The memory device may further include a second bit line pair, a second precharge circuit, and a second power switch circuit. The second precharge circuit may be configured to precharge the second bit line pair. The second power switch circuit may be configured to selectively supply or cut off the power supply voltage to the second precharge circuit. The second precharge circuit may be placed symmetrically to the first precharge circuit with respect to an axis. The second power switch circuit may be placed symmetrically to the first power switch circuit with respect to the axis.

According to an exemplary embodiment of the present inventive concept, a memory device is provided. The memory device includes a plurality of word lines, a plurality of bit line pairs, a row decoder, a plurality of bit cells, and an input/output (I/O) circuit. The plurality of word lines extends in a first direction. The plurality of bit line pairs extends in a second direction crossing the first direction. The row decoder selects one of the word lines in response to an input row address signal. The plurality of bit cells stores data. Each of the bit cells is connected to one of the word lines and one of the bit line pairs. The I/O circuit includes a column decoder, a precharge circuit, and a power switch circuit. The column decoder selects one of the bit line pairs in response to an input column address signal. The precharge circuit precharges the bit line pairs with a precharge voltage. The power switch circuit supplies a power supply voltage to the precharge circuit. One node of the power switch circuit is connected to one node of the precharge circuit using a shared semiconductor junction.

The power switch circuit may include a first power transistor selectively supplying or cutting off the power supply voltage to a first precharge transistor of the precharge circuit through the shared semiconductor junction. A first source or drain of the first power transistor may be connected to a power voltage source. A second source or drain of the first power transistor may be formed in common with a first source or drain of the first precharge transistor. The first precharge transistor may precharge a first bit line pair of the plurality of bit line pairs.

The first bit line pair may include a first bit line and a first bit-bar line, and a second source or drain of the first precharge transistor may be connected to the first bit line.

The power switch circuit may be formed above and below the precharge circuit.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Figure 1:
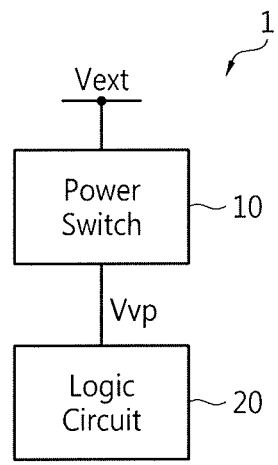
FIG. 1 is a schematic block diagram of a semiconductor device according to an embodiment of the present inventive concept.

The present inventive concept now will be described more fully hereinafter with reference to the accompanying drawings, in which embodiments of the present inventive concept are shown. The present inventive concept may, however, be embodied in many different forms and should not be construed as limited to the embodiments set forth herein. In the drawings, the size and relative sizes of layers and regions may be exaggerated for clarity. Like numbers may refer to like elements throughout the specification and drawings.

As used herein, the term "and/or" includes any and all combinations of one or more of the associated listed items and may be abbreviated as "/".

As used herein, the singular forms "a", "an" and "the" are intended to include the plural forms as well, unless the context clearly indicates otherwise.

Figure 2:
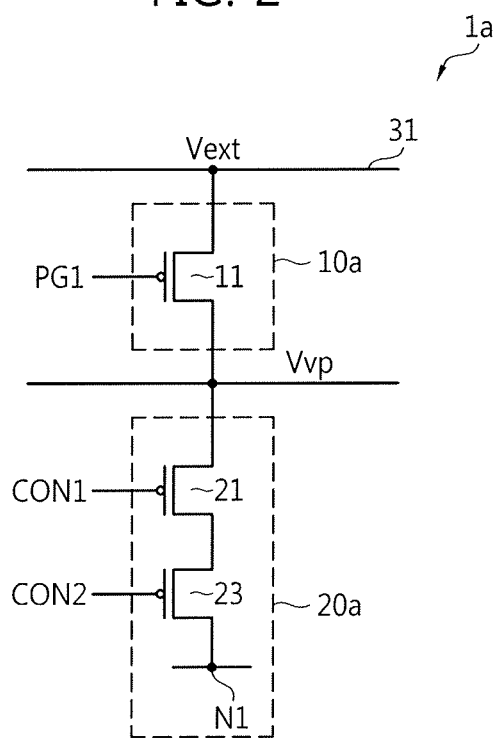
FIG. 2 is a schematic circuit diagram of a semiconductor device according to an embodiment of the present inventive concept.
Figure 3:
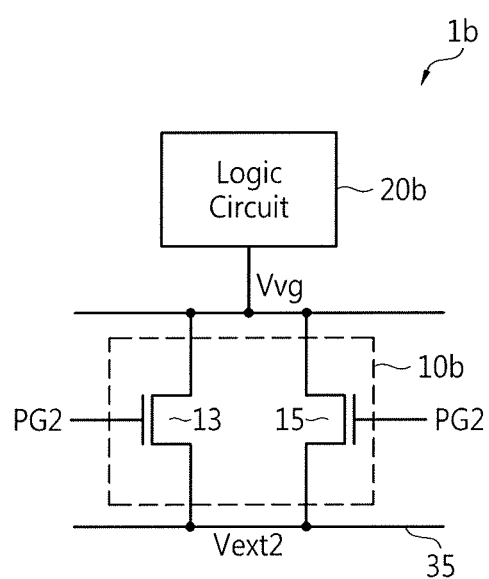
FIG. 3 is a schematic circuit diagram of a semiconductor device according to an embodiment of the present inventive concept.

FIG. 1 is a schematic block diagram of a semiconductor device 1 according to an embodiment of the present inventive concept. FIG. 2 is a schematic circuit diagram of a semiconductor device 1a according to an embodiment of the present inventive concept. FIG. 3 is a schematic circuit diagram of a semiconductor device 1b according to an embodiment of the present inventive concept.

Referring to FIG. 1, the semiconductor device 1 includes a power switch circuit 10 and a logic circuit 20. The power switch circuit 10 is connected between a power supply voltage Vext and the logic circuit 20 to selectively supply the power supply voltage Vext to the logic circuit 20. The power switch circuit 10 may include at least one transistor (hereinafter, referred to as a "power transistor"). The power switch circuit 10 receives the power supply voltage Vext, generates a first gating voltage Vvp, and output the first gating voltage Vvp to the logic circuit 20.

The logic circuit 20 performs functions of the semiconductor device 1 and includes at least one transistor (hereinafter, referred to as a "logic transistor"). The logic circuit 20 may include various kinds of elements such as a flip-flop, a latch, an amplifier, a memory cell, or the like.

Referring to FIG. 2, the semiconductor device 1a includes a power switch circuit 10a and a logic circuit 20a. The power switch circuit 10a may include a first power transistor 11 connected between a first power line 31 and the logic circuit 20a. The first power line 31 may include a metal line, a via, and a contact to provide the first power supply voltage Vext. The via and the contact may be a medium for connecting a metal and a metal or a metal and a material other than a metal.

The first power transistor 11 may receive a power gating control signal PG1 through a gate, may be connected to the first power line 31 through a first source/drain, and may be connected to a first logic transistor 21 of the logic circuit 20a through a second source/drain. Hereinafter, the term "source/drain" may be understood to mean either a source or a drain of a transistor. For example, a source/drain may operate as either a source (or a source region) or a drain (or a drain region) of a transistor according to a voltage applied thereto.

The logic circuit 20a may include the first logic transistor 21 and a second logic transistor 23, which are connected in series between the power switch circuit 10a and a first node N1. The first and second logic transistors 21 and 23 may operate in response to first and second control signals CON1 and CON2, respectively.

The first power transistor 11 and the first logic transistor 21 are directly connected to each other using a shared semiconductor junction (e.g., a PN junction) instead of using a metal, which will be described in detail with reference to FIGS. 4A and 4B later. Each of the first power transistor 11 and the first and second logic transistors 21 and 23 may be formed of a P-channel metal-oxide semiconductor (PMOS) transistor, but the present inventive concept is not restricted to this example.

When the power switch circuit 10a is in an on-state, the power switch circuit 10a applies the first power supply voltage Vext to logic circuit 20a as the first gating voltage Vvp. When the power switch circuit 10a is in an off-state, it cuts off the first power supply voltage Vext. For example, the power switch circuit 10a functions as a power gating circuit that selectively applies or cuts off the first power supply voltage Vext to the logic circuit 20a.

Referring to FIG. 3, the semiconductor device 1b includes a power switch circuit 10b and a logic circuit 20b. The power switch circuit 10b may include second and third power transistors 13 and 15 connected in parallel between a second power line 35 and the logic circuit 20b. The second power line 35 may include a metal line, a via, and a contact to provide a second power supply voltage Vext2.

Each of the second and third power transistors 13 and 15 may receive a power gating control signal PG2 through a gate thereof, and may be directly connected to the logic circuit 20b through a first source/drain. The second and third power transistors 13 and 15 each may be formed of an N-channel metal-oxide semiconductor (NMOS) transistor, but the present inventive concept is not restricted to this example. The second and third power transistors 13 and 15 may be directly connected with a logic transistor in the logic circuit 20b using a shared semiconductor junction instead of using a metal.

When the power switch circuit 10b is in an on-state, the power switch circuit 10b applies the second power supply voltage Vext2 to the logic circuit 20b as a second gating voltage Vvg. When the power switch circuit 10b is in an off-state, the power switch circuit 10b cuts off the second power supply voltage Vext2. For example, the power switch circuit 10b functions as a power gating circuit that selectively applies or cuts off the second power supply voltage Vext2 to the logic circuit 20b. The second power supply voltage Vext2 may be a ground voltage or a negative voltage, but the present inventive concept is not restricted to these examples.

In an exemplary embodiment of the present inventive concept, a semiconductor device (e.g., 1 of FIG. 1) may include the power switch circuits 10a and 10b illustrated in FIGS. 2 and 3.

Figure 4A:
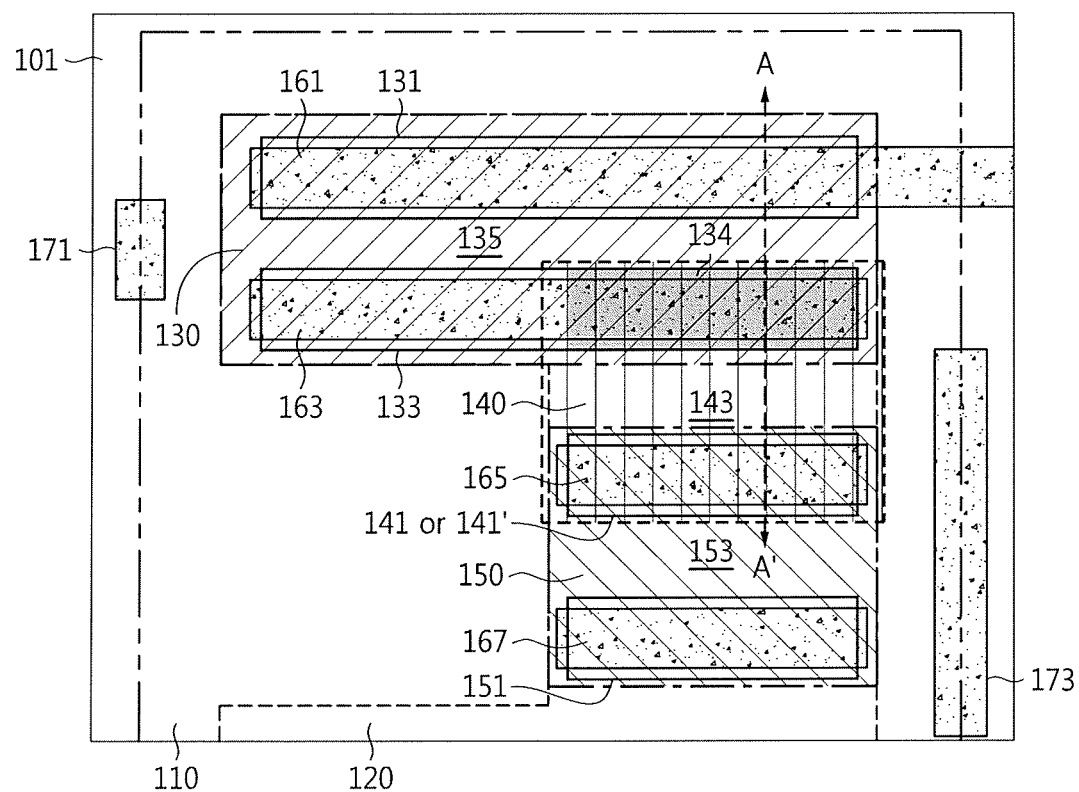
FIG. 4A is a diagram of a layout used to form a power switch circuit and a logic circuit illustrated in FIG. 2 according to an embodiment of the present inventive concept.

FIG. 4A is a diagram of a layout used to form the power switch circuit 10a and the logic circuit 20a illustrated in FIG. 2 according to an embodiment of the present inventive concept. FIG. 4B is a cross-sectional view of a semiconductor substrate 101 illustrated in FIG. 4A, taken along a line A-A' according to an embodiment of the present inventive concept.

Figure 4B:
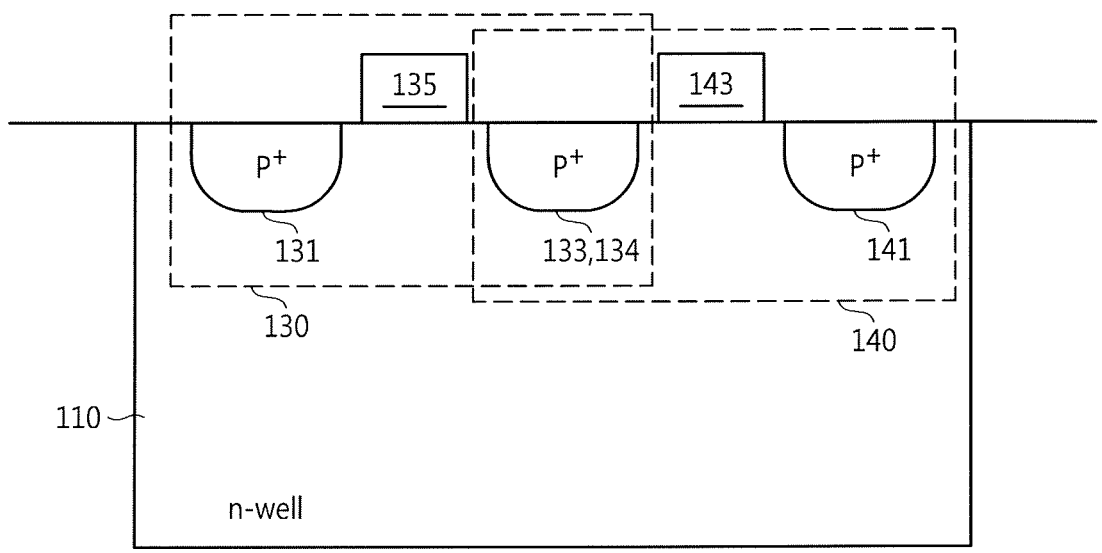
FIG. 4B is a cross-sectional view of a semiconductor substrate illustrated in FIG. 4A, taken along a line A-A' according to an embodiment of the present inventive concept.

Referring to FIGS. 2, 4A, and 4B, an n-well 110 is formed in the semiconductor substrate 101, and sources and drains of transistors are formed in an active region 120 within the n-well 110. In FIGS. 4A and 4B, reference numeral 130 denotes a region in which the first power transistor 11 is formed, reference numeral 140 denotes a region in which the first logic transistor 21 is formed, and reference numeral 150 denotes a region in which the second logic transistor 23 is formed.

A first source/drain 131 and a second source/drain 133 of the first power transistor 11, a second source/drain 141 of the first logic transistor 21, and a second source/drain 151 of the second logic transistor 23 are formed in parallel with each other and are spaced apart from each other. A gate 135 of the first power transistor 11 is formed between the first source/drain 131 and the second source/drain 133.

The second source/drain 133 of the first power transistor 11 is formed in common with a first source/drain 134 of the first logic transistor 21. For example, at least part of the second source/drain 133 of the first power transistor 11 and at least part of the first source/drain 134 of the first logic transistor 21 form a shared semiconductor junction (e.g., a PN junction).

A gate 143 of the first logic transistor 21 is formed between the first source/drain 134 and the second source/drain 141 of the first logic transistor 21. The second source/drain 141 of the first logic transistor 21 is formed in common with a first source/drain 141' of the second logic transistor 23. For example, at least part of the second source/drain 141 may correspond to at least part of the first source/drain 141'.

A gate 153 of the second logic transistor 23 is formed between the first source/drain 141 and the second source/drain 151 of the second logic transistor 23.

In addition, contact regions 161, 163, 165, 167, 171, and 173 may be formed, as shown in FIG. 4A. The contact regions 161, 163, 165, and 167 may apply a voltage to each source/drain 131, 133, 134, 141, or 151 or connect each source/drain 131, 133, 134, 141, or 151 to another element. The contact regions 171 and 173 may apply a signal to each gate 135, 143, or 153. A layer in which each source/drain 131, 133, 134, 141, or 151 is formed, a layer in which each gate 135, 143, or 153 is formed, and a layer in which the contact regions 161, 163, 165, and 167 are formed may be different from one another. As shown in FIG. 4A, the first power transistor 11 may be larger than the logic transistor 21 or 23.

Figure 5A:
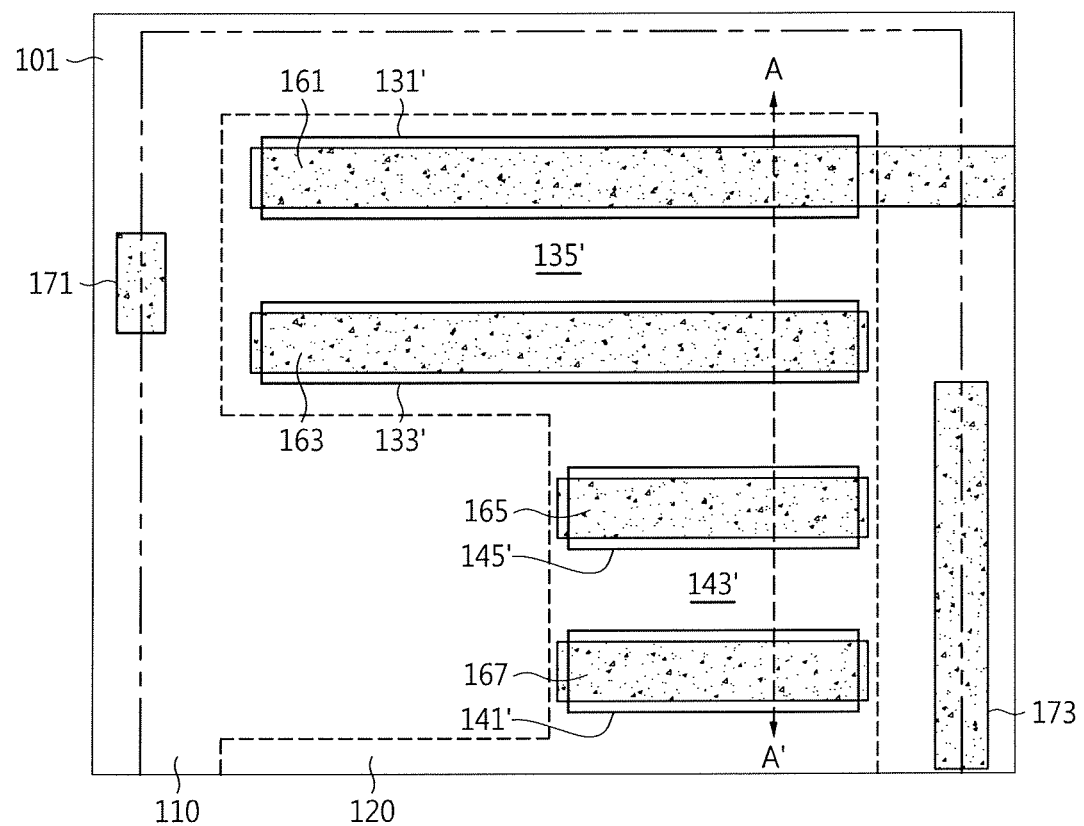
FIGS. 5A and 5B are diagrams of comparison examples of FIGS. 4A and 4B, respectively.
Figure 5B:
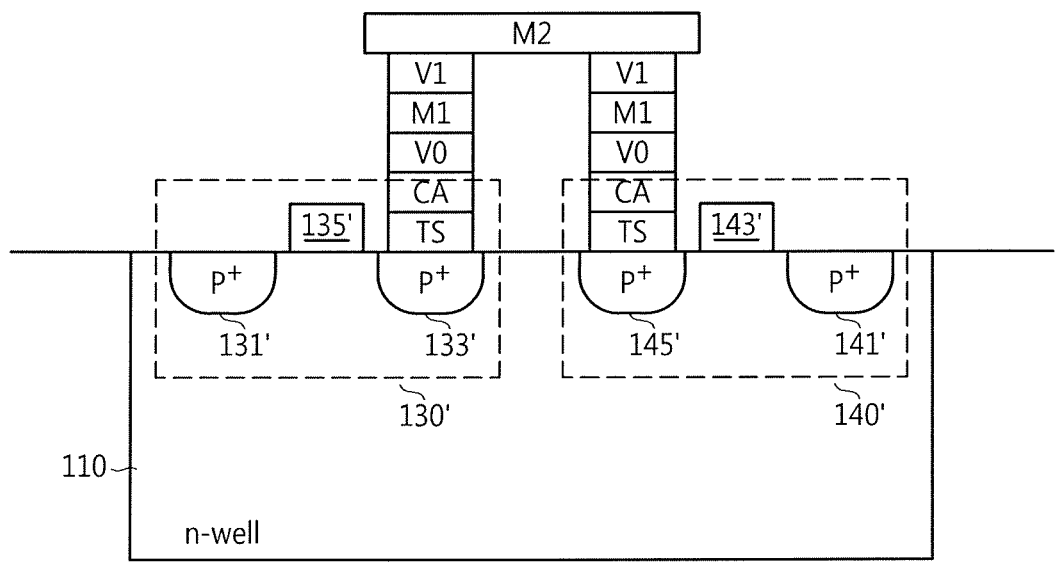

FIGS. 5A and 5B are diagrams of comparison examples of FIGS. 4A and 4B, respectively. Referring to FIGS. 5A and 5B, a first source/drain 131' and a second source/drain 133' of the first power transistor 130' and a first source/drain 145' and a second source/drain 141' of the first logic transistor 140' are formed in parallel with each other and are spaced apart from each other. A gate 135' of the first power transistor 130' is formed between the first source/drain 131' and the second source/drain 133'. A gate 143' of the first logic transistor 140' is formed between the first source/drain 145' and the second source/drain 141' of the first logic transistor 21.

The second source/drain 133' of the first power transistor 130' is separately formed from the first source/drain 145' of the first logic transistor 140'. For example, the second source/drain 133' of the first power transistor 130' and the first source/drain 145' of the first logic transistor 140' do not form a shared semiconductor junction (e.g., a PN junction) and are connected to each other through multiple layers of metal lines M1 and M2, vias V0 and V1, and contacts TS and CA, as shown in FIG. 5B.

When a power transistor and a logic transistor are connected to each other through multiple layers of metal lines, vias, and contacts, a resistance value is relatively high in connection passages (e.g., contacts, vias, and metal lines). In addition, a resistance value of the contact TS directly connected to the sources/drains 133' and 145' is relatively high. Thus, a voltage drop occurs, so that the level of a voltage applied to the logic transistor may abruptly plummet from a power supply voltage level. To avoid such voltage drop, the size of the power transistor or the number of power transistors connected to the logic transistor may need to be increased.

According to an embodiment of the present inventive concept illustrated in FIGS. 4A and 4B, the first logic transistor 21 (e.g., 140) is directly connected to the first power transistor 11 (e.g., 130) using a shared semiconductor junction, and thus, an instantaneous voltage drop may be reduced.

Figure 6:
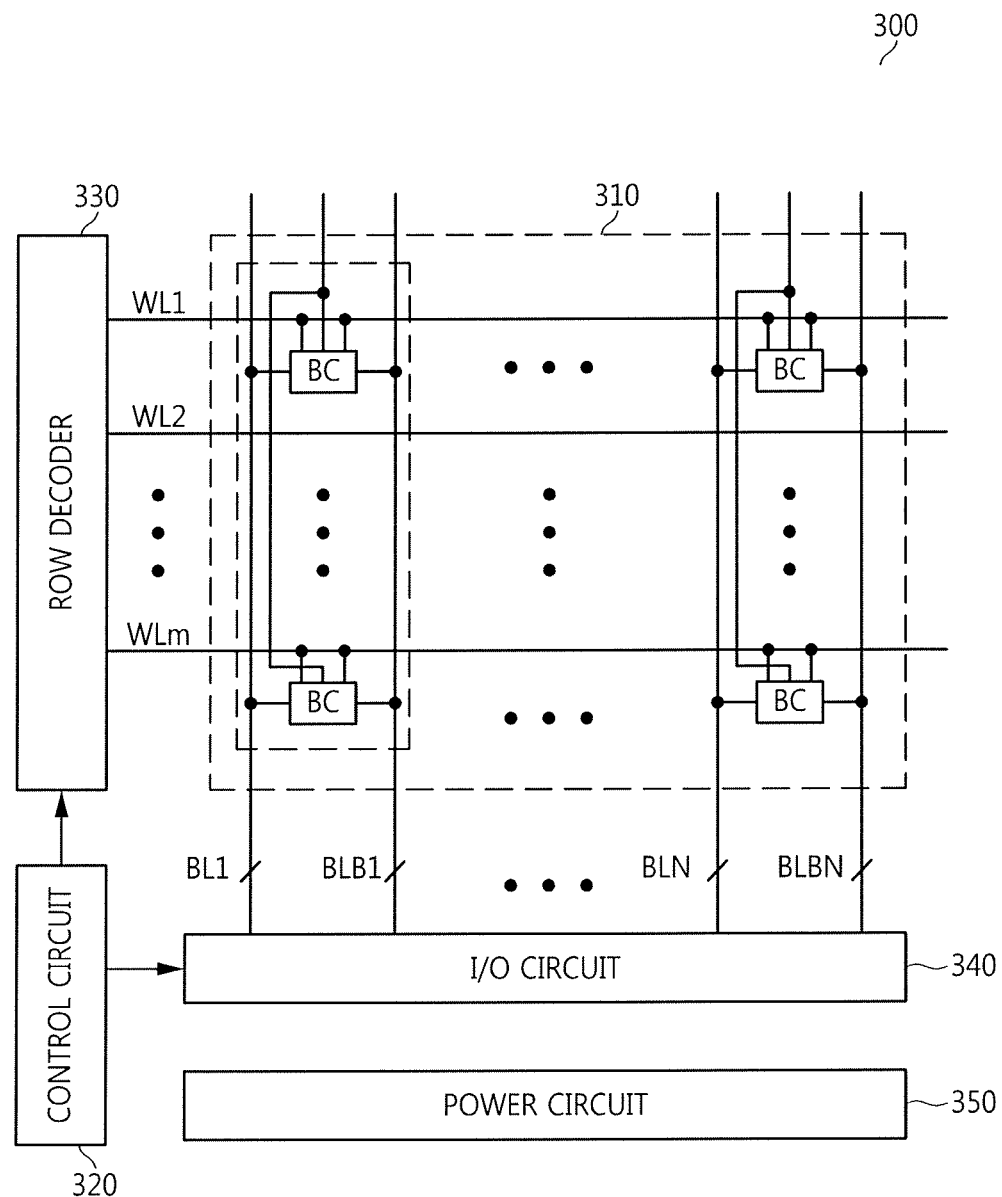
FIG. 6 is a block diagram of a static memory device according to an embodiment of the present inventive concept.
Figure 7:
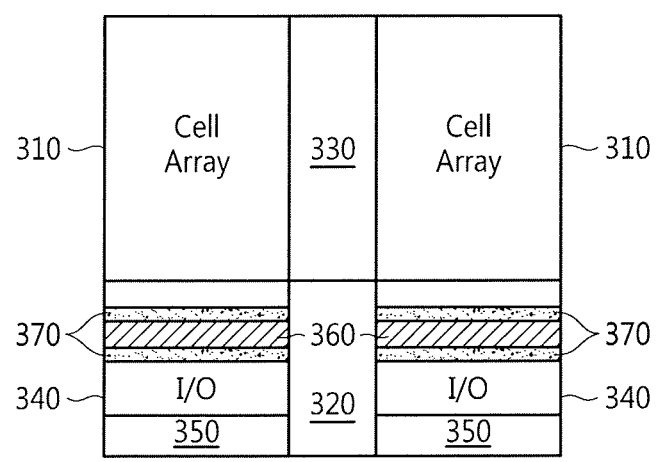
FIG. 7 is a diagram of a layout of the static memory device illustrated in FIG. 6 according to an embodiment of the present inventive concept.

FIG. 6 is a block diagram of a static memory device 300 according to an embodiment of the present inventive concept. FIG. 7 is a diagram of a layout of the static memory device 300 illustrated in FIG. 6 according to an embodiment of the present inventive concept. The static memory device 300 illustrated in FIGS. 6 and 7 may be an exemplary embodiment of the semiconductor device 1 illustrated in FIG. 1.

Referring to FIGS. 6 and 7, the static memory device, e.g., static random access memory (SRAM) device 300, includes a plurality of word lines WL1 through WLm, a plurality of bit line pairs BL1 and BLB1 through BLN and BLBN, a bit cell array 310, a control circuit 320, a row decoder 330, an input/output (I/O) circuit 340, and a power circuit 350. The bit line pairs BL1 and BLB1 through BLN and BLBN cross the word lines WL1 through WLm and include bit lines BL1 through BLN and bit-bar lines BLB1 through BLBN.

The bit cell array 310 includes a plurality of bit cells BC. Each of the bit cells BC is a memory cell which is connected to one of the word lines WL1 through WLm and connected between one of the bit lines BL1 through BLN and a corresponding one of the bit-bar lines BLB1 through BLBN to store cell data. The row decoder 330 selects one of the word lines WL1 through WLm in response to an externally input row address signal.

The I/O circuit 340 may include a column decoder, a write buffer, and a sense amplifier. The column decoder generates a column selection signal for selecting one of the bit line pairs BL1 and BLB1 through BLN and BLBN in response to an externally input column address signal, and thus, one of the bit line pairs BL1 and BLB1 through BLN and BLBN is selected. The write buffer receives input data from an outside and writes the input data to a selected bit cell BC during a write operation. The sense amplifier generates output data by amplifying a voltage difference between a bit line and a bit-bar line, which are connected to the selected bit cell BC, during a read operation. In addition, the I/O circuit 340 may include a precharge circuit 360 for precharging the bit line pairs BL1 and BLB1 through BLN and BLBN with a precharge voltage.

The control circuit 320 may control the operations of the row decoder 320 and the I/O circuit 340. The power circuit 350 provides power for the elements 310, 320, 330, and 340 of the static memory device 300.

As shown in FIG. 7, the bit cell array 310 may be formed at the both sides of the row decoder 330. The I/O circuit 340 may be formed below the bit cell array 310 at the both sides of the control circuit 320. The power circuit 350 may be formed below the I/O circuit 340.

The I/O circuit 340 may include the precharge circuit 360 and a power switch circuit 370 formed above and below the precharge circuit 360. The precharge circuit 360 may correspond to the logic circuit 20 of FIG. 1 and the power switch circuit 370 may correspond to the power switch circuit 10 of FIG. 1.

Figure 8:
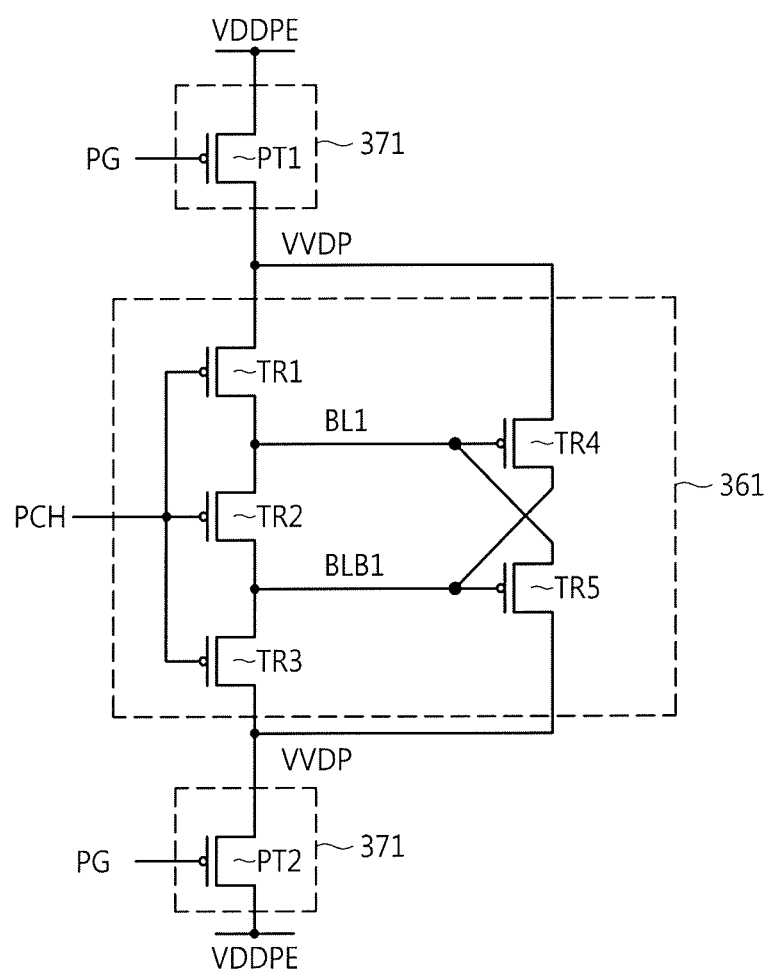
FIG. 8 is a circuit diagram of a precharge circuit and a power switch circuit illustrated in FIG. 7 according to an embodiment of the present inventive concept.

FIG. 8 is a circuit diagram of the precharge circuit 360 and the power switch circuit 370 illustrated in FIG. 7 according to an embodiment of the present inventive concept. For example, the precharge circuit 360 may include first through N precharge circuit, and the power switch circuit 370 may include first through N power switch circuits. For the purpose of illustration, the first precharge circuit 361 connected to the first bit pair BL1 and BLB1 and a first power switch circuit 371 are representatively shown in FIG. 8. Substantially the same precharge circuit as the first precharge circuit 361 and substantially the same power switch circuit as the first power switch circuit 371 may be provided for each of the bit line pairs BL2 and BLB2 through BLN and BLBN.

The first precharge circuit 361 is connected to the first power switch circuit 371 using a shared semiconductor junction. The first precharge circuit 361 precharges the first bit line pair BL1 and BLB1 with a precharge voltage VVDP. The first precharge circuit 361 may include first through fifth precharge transistors TR1 through TR5.

The first power switch circuit 371 provides the precharge voltage VVDP to the first precharge circuit 361 through the shared semiconductor junction. The first power switch circuit 371 may include first and second power transistors PT1 and PT2. The first power switch circuit 371 supplies the precharge voltage VVDP corresponding to an external power supply voltage VDDPE to the first precharge circuit 361 when the first power switch circuit 371 is in an on-state, and cuts off the supply of the precharge voltage VVDP corresponding to the external power supply voltage VDDPE when the first power switch circuit 371 is in an off-state. For example, the first power switch circuit 371 is a power gating circuit which selectively supplies or cuts off the external power supply voltage VDDPE.

Each of the first through fifth precharge transistors TR1 through TR5 and the first and second power transistors PT1 and PT2 may be formed of a PMOS transistor, but the present inventive concept is not restricted thereto. The size of each of the first and second power transistors PT1 and PT2 may be at least two (e.g., two, four, ten, or the like) times of that of each of the first through fifth precharge transistors TR1 through TR5. For example, the size of each of the first and second power transistors PT1 and PT2 may be at least twofold of that of each of the first through fifth precharge transistors TR1 through TR5, or the ratio of width to length of each of the first and second power transistors PT1 and PT2 may be at least two times of that of each of the first through fifth precharge transistors TR1 through TR5.

The first precharge transistor TR1 is connected between the first power transistor PT1 and the first bit line BL1 to supply the precharge voltage VVDP to the first bit line BL1. The third precharge transistor TR3 is connected between the second power transistor PT2 and the first bit-bar line BLB1 to supply the precharge voltage VVDP to the first bit-bar line BLB1. The second precharge transistor TR2 is connected between the first bit line BL1 and the first bit-bar line BLB1 to make the voltage of the first bit line BL1 equal to the voltage of the first bit-bar line BLB1. The fourth precharge transistor TR4 and the fifth precharge transistor TR5 are cross-coupled, and thus, the precharge voltage VVDP is supplied to each of the first bit-bar line BLB1 and the first bit line BL1. Each of the first and second power transistors PT1 and PT2 is turned on or off in response to a power gating control signal PG. For example, a source/drain (e.g., 183' of FIG. 9) of the fifth precharge transistor TR5 may be commonly connected to a gate (e.g., 182 of FIG. 9) of the fourth precharge transistor TR4 and a first bit line BL1 to apply the precharge voltage to the first bit line BL1, a source/drain (e.g., 183 of FIG. 9) of the fourth precharge transistor TR4 may be commonly connected to a gate (e.g., 184 of FIG. 9) of the fifth precharge transistor TR5 and a first bit-bar line BLB1 to apply the precharge voltage to the first bit-bar line BLB1.

Figure 9:
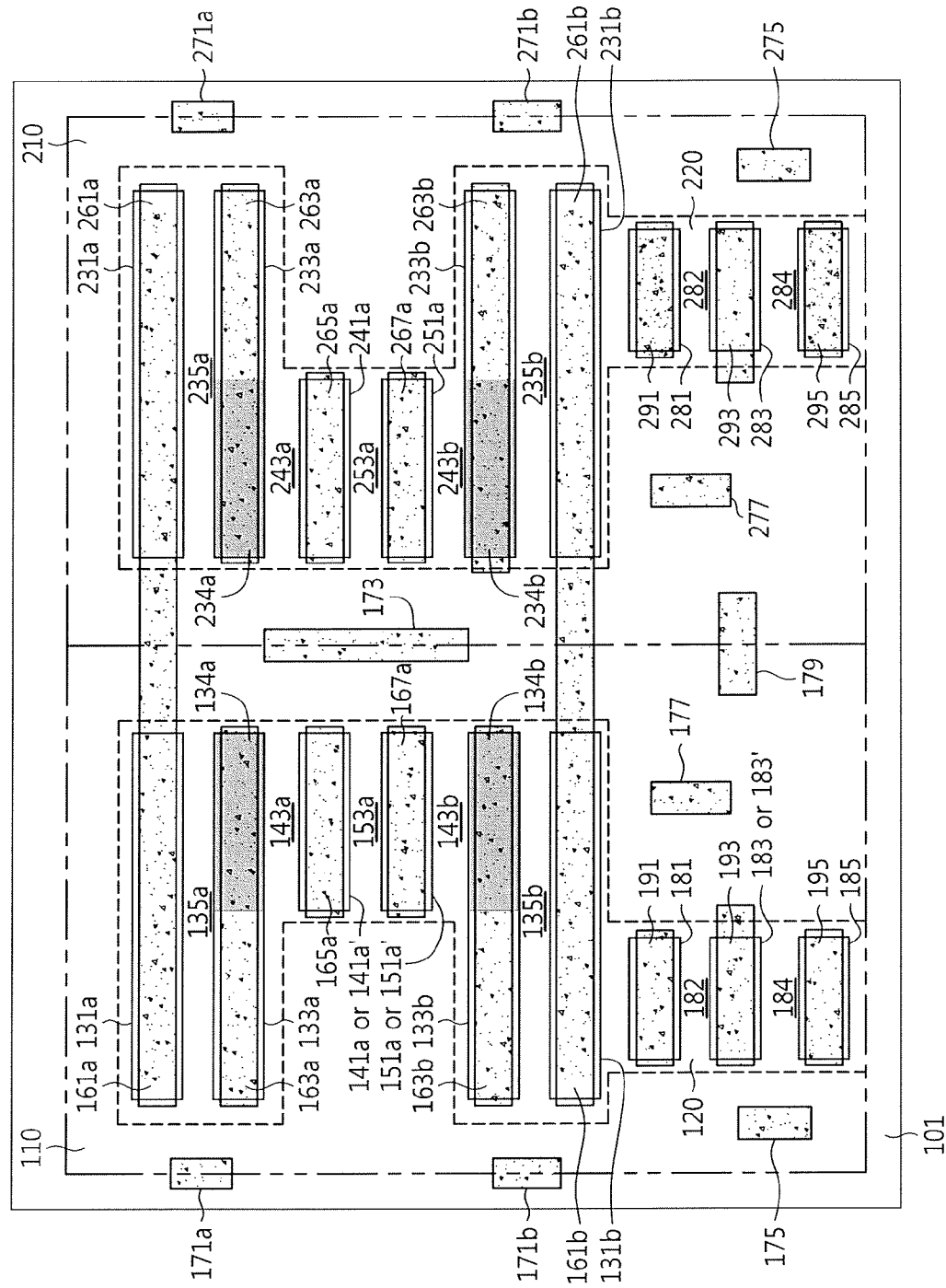
FIG. 9 is a diagram of a layout of a first precharge circuit and a first power switch circuit illustrated in FIG. 8 according to an embodiment of the present inventive concept.

FIG. 9 is a diagram of a layout of a first precharge circuit 361 and a first power switch circuit 371 illustrated in FIG. 8 according to an embodiment of the present inventive concept. Referring to FIG. 9, the first n-well 110 and a second n-well 210 are formed in the semiconductor substrate 101. The first power switch circuit 371 and the first precharge circuit 361 are formed in the first active region 120 within the first n-well 110.

A second power switch circuit and a second precharge circuit are formed in a second active region 220 within the second n-well 210. The second power switch circuit and the second precharge circuit are connected to the second bit line pair BL2 and BLB2. The second power switch circuit and the second precharge circuit have substantially the same structure as the first power switch circuit 371 and the first precharge circuit 361, respectively. The second power switch circuit is symmetrical to the first power switch circuit 371 with respect to an axis (e.g., y-axis) extended from a bit line. The second precharge circuit is symmetrical to the first precharge circuit 361 with respect to the axis extended from a bit line.

Therefore, to avoid redundancy, the layout of the first power switch circuit 371 and the first precharge circuit 361 only will be described. For example, each of elements 220, 231a, 231b, 233a, 233b, 234a, 234b, 235a, 235b, 241a, 243a, 243b, 251a, 253a, 261a, 263a, 263b, 265a, 267a, 281, 282, 283, 284, 285, 291, 293, and 295, which correspond to the second line pair BL2 and BLB2, may have substantially the same structure and function as a corresponding one of the elements 120, 131a, 131b, 133a, 133b, 134a, 134b, 135a, 135b, 141a, 143a, 143b, 151a, 153a, 161a, 163a, 163b, 165a, 167a, 181, 182, 183, 184, 185, 191, 193, and 195 which correspond to the first line pair BL1 and BLB1.

Referring back to FIGS. 8 and 9, a first source/drain 131a and a second source/drain 133a of the first power transistor PT1, a second source/drain 141a of the first precharge transistor TR1, a second source/drain 151a of the second precharge transistor TR2, and a second source/drain 133b and a first source/drain 131b of the second power transistor PT2 are placed in parallel with each other and are spaced apart from each other. A gate 135a of the first power transistor PT1 is formed between the first source/drain 131a and the second source/drain 133a of the first power transistor PT1.

The second source/drain 133a of the first power transistor PT1 is formed in common with a first source/drain 134a of the first precharge transistor TR1. For example, at least part of the second source/drain 133a of the first power transistor PT1 and at least part of the first source/drain 134a of the first precharge transistor TR1 form a shared semiconductor junction (e.g., a PN junction).

A gate 143a of the first precharge transistor TR1 is formed between the first source/drain 134a and the second source/drain 141a of the first precharge transistor TR1. The second source/drain 141a of the first precharge transistor TR1 is formed in common with a first source/drain 141a' of the second precharge transistor TR2. For example, at least part of the second source/drain 141a may correspond to at least part of the first source/drain 141a'.

A gate 153a of the second precharge transistor TR2 is formed between the first source/drain 141a and the second source/drain 151a of the second precharge transistor TR2. A first source/drain 151a' of the third precharge transistor TR3 is formed in common with the second source/drain 151a of the second precharge transistor TR2. For example, at least part of the second source/drain 151a may correspond to at least part of the first source/drain 151a'.

A gate 143b of the third precharge transistor TR3 is formed between the first source/drain 151a' and a second source/drain 134b of the third precharge transistor TR3. The second source/drain 133b of the second power transistor PT2 is formed in common with the second source/drain 134b of the third precharge transistor TR3. For example, at least part of the second source/drain 133b of the second power transistor PT2 and at least part of the second source/drain 134b of the third precharge transistor TR3 form a shared semiconductor junction (e.g., a PN junction).

A gate 135b of the second power transistor PT2 is formed between the second source/drain 133b and the first source/drain 131b of the second power transistor PT2. In the layout view of FIG. 9, below the first source/drain 131b of the second power transistor PT2 are formed a first source/drain 181 and a second source/drain 183 of the fourth precharge transistor TR4 and a second source/drain 185 of the fifth precharge transistor TR5 in parallel with each and spaced apart from each other. The second source/drain 183 of the fourth precharge transistor TR4 is formed in common with a first source/drain 183' of the fifth precharge transistor TR5.

For example, at least part of the second source/drain 183 may correspond to at least part of the first source/drain 183'. A gate 182 of the fourth precharge transistor TR4 is formed between the first source/drain 181 and the second source/drain 183 of the fourth precharge transistor TR4. A gate 184 of the fifth precharge transistor TR5 is formed between the first source/drain 183' and the second source/drain 185 of the fifth precharge transistor TR5.

Contact regions 161a, 161b, 163a, 163b, 165a, 165b, 167a, 191, 193, and 195 may be formed as shown in FIG. 9. The contact regions may apply a voltage to each source/drain 131a, 131b, 133a, 133b, 134a, 134b, 141a, 141b, 151a, 181, 183, or 184 or may connect each source/drain 131a, 131b, 133a, 133b, 134a, 134b, 141a, 141b, 151a, 181, 183, or 184 to another element. In addition, contact regions 171a, 171b, 173, 175, and 177 may be formed as shown in FIG. 9. The contact regions 171a, 171b, 173, 175, and 177 may apply a signal to each gate 135a, 135b, 143a, 143b, 153a, 182, or 184. In addition, a contact region 179 for applying a bulk voltage to a bulk of the fourth and fifth precharge transistors TR4 and TR5 may be formed as shown in FIG. 9.

As shown in FIGS. 8 and 9, the first and second power transistors PT1 and PT2 are directly connected to the first and third precharge transistors TR1 and TR3, respectively, of the precharge circuit 361 using a shared semiconductor junction instead of using a metal, and thus, an instantaneous voltage drop is reduced as compared to a connection method using a metal line, a via, a contact, or the like. For example, the precharge circuit 360 may consume a relatively large power in the static memory device 300. Accordingly, when a power transistor (e.g., PT1) and a precharge circuit (e.g., TR1) are connected to each other using a metal line, a voltage drop may occur, and thus, a precharge voltage may abruptly be decreased due to the metal connection. However, according to an embodiment of the present inventive concept, the first and second power transistors PT1 and PT2 are connected to the first and third precharge transistors TR1 and TR3, respectively, of the precharge circuit 361 using a shared semiconductor junction, and thus, an instantaneous voltage drop in the precharge circuit 361 may be reduced.

Figure 10:
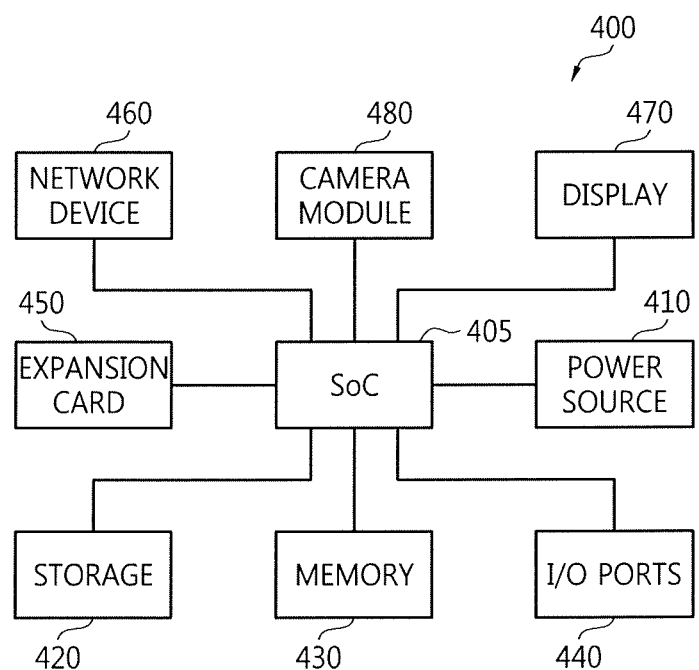
FIG. 10 is a block diagram of an electronic system according to an embodiment of the present inventive concept.

FIG. 10 is a block diagram of an electronic system 400 according to an embodiment of the present inventive concept. The electronic system 400 may be implemented as a personal computer (PC), a data server, a laptop computer, a portable device, or the like. The portable device may be a cellular phone, a smart phone, a tablet PC, a personal digital assistant (PDA), an enterprise digital assistant (EDA), a digital still camera, a digital video camera, a portable multimedia player (PMP), a personal navigation device, a portable navigation device (PND), a handheld game console, an e-book, or the like. The electronic system 400 includes a system on chip (SoC) 405, a power source 410, a storage 420, a memory 430, I/O ports 440, an expansion card 450, a network device 460, a display 470, or the like. The electronic system 400 may also include a camera module 480.

The SoC 405 may control the operation of at least one of the elements 410 through 480. The SoC 405 may include the semiconductor device 1 illustrated in FIG. 1 or the static memory device 300 illustrated in FIG. 6.

The power source 410 may provide an operating voltage to at least one of the elements 405 and 420 through 480. The storage 420 may be a hard disk drive (HDD), a solid state drive (SSD), or the like.

The memory 430 may be formed of volatile memory. In an exemplary embodiment of the present inventive concept, the memory 430 may be formed of non-volatile memory. A memory controller, which controls a data access operation (e.g., a read operation, a write operation (or a program operation), or an erase operation) on the memory 430, may be integrated into or embedded in the SoC 405. In an exemplary embodiment of the present inventive concept, the memory controller may be provided between the SoC 405 and the memory 430.

The I/O ports 440 may receive data transmitted to the electronic system 400 or transmits data from the electronic system 400 to an external device. For example, the I/O ports 440 may include a port for connection with a pointing device such as a computer mouse, a port for connection with a printer, and a port for connection with a universal serial bus (USB) drive.

The expansion card 450 may be implemented as a secure digital (SD) card, a multimedia card (MMC), or the like. The expansion card 450 may be a subscriber identity module (SIM) card, a universal SIM (USIM) card, or the like.

The network device 460 enables the electronic system 400 to be connected with a wired or wireless network. The display 470 displays data output from the storage 420, the memory 430, the I/O ports 440, the expansion card 450, the network device 460, or the like.

The camera module 480 is a module that can convert an optical image into an electrical image. Accordingly, the electrical image output from the camera module 480 may be stored in the storage 420, the memory 430, the expansion card 450, or the like. In addition, the electrical image output from the camera module 480 may be displayed through the display 470.

Figure 11:
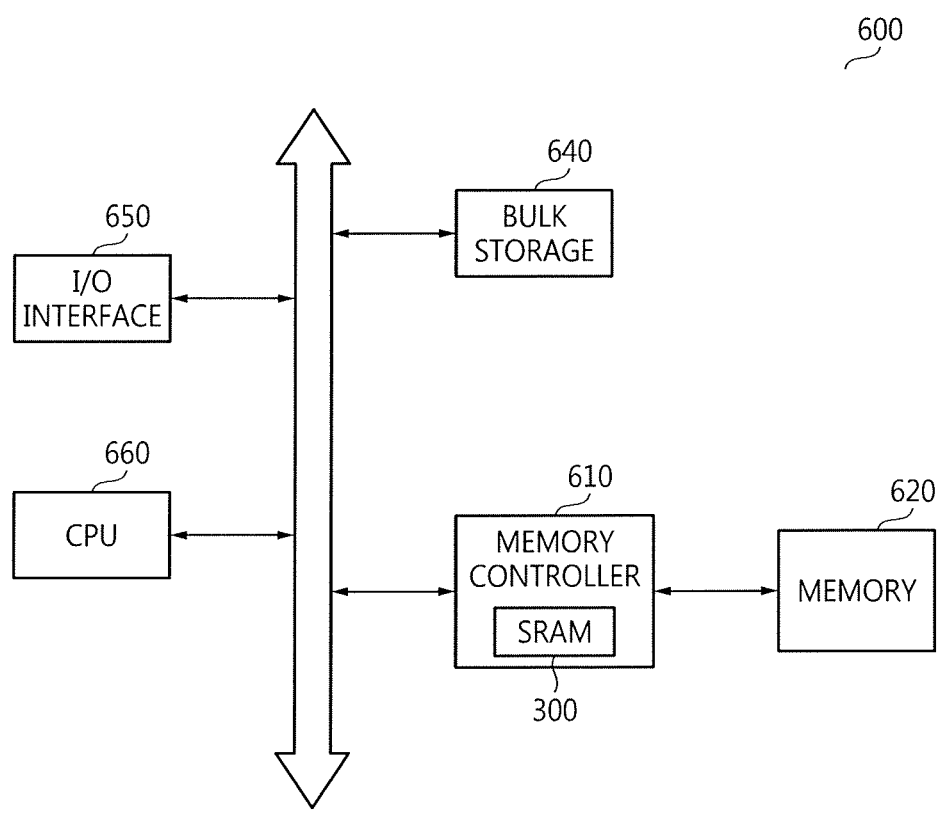
FIG. 11 is a block diagram of an electronic system according to an embodiment of the present inventive concept.

FIG. 11 is a block diagram of an electronic system 600 according to an embodiment of the present inventive concept. Referring to FIG. 11, the electronic system 600 includes a memory controller 610, a memory 620, a bulk storage 640, an I/O interface 650, and a central processing unit (CPU) 660, which may be connected one to another via a bus 630. The memory controller 610 may include the SRAM device 300 illustrated in FIG. 6. The memory 620 includes flash memory, phase-change RAM (PRAM), and magnetic RAM (MRAM). The bulk storage 640 includes an SSD, an HDD, and a network attached storage (NAS). The I/O interface 650 may be connected to a network port which can be connected to a network. In an exemplary embodiment of the present inventive concept, the I/O interface 650 may be directly connected to the network.

During the operation of the electronic system 600, the CPU 660 may control the memory controller 610 and the memory 620. The memory controller 610 controls the memory 620. Here, particular components of the electronic system 600 may be changed. For example, the CPU 660 may be one of various types of CPUs and the memory 620 may be any one of various types of memory including different types of memory. The electronic system 600 is not restricted to the structure illustrated in FIG. 11, and may additionally include other components.

The electronic system 600 including the SRAM device 300 illustrated in FIG. 11 is an exemplary embodiment using the SRAM device 300. The SRAM device 300 may be used for any kind of electronic system requiring SRAM.

As described above, according to an embodiment of the present inventive concept, a power switch circuit for selectively supplying or cutting off a power supply voltage to a logic circuit is connected to the logic circuit using a shared semiconductor junction, without using, e.g., a metal, a via, a contact, or the like, and thus, an instantaneous voltage drop in the logic circuit may be reduced. For example, a precharge circuit consuming a relatively large power in a static memory device is directly connected to a power switch circuit using a shared semiconductor junction, and thus, a voltage drop by which a precharge voltage instantaneously falls is prevented or reduced.

While the present inventive concept has been particularly shown and described with reference to exemplary embodiments thereof, it will be understood that various changes in forms and details may be made therein without departing from the spirit and scope of the present inventive concept as defined by the following claims.

What is claimed is:

1. A semiconductor device comprising:
a power line configured to provide a power supply voltage;
a first logic transistor including a first gate, a first source and a first drain;
a second logic transistor connected to the first logic transistor, and including a second gate, a second source and a second drain;
a third logic transistor connected to the second logic transistor, and including a third gate, a third source and a third drain;
a first power transistor connected between the power line and the first logic transistor, the first power transistor including a fourth gate, a fourth source and a fourth drain; and
a second power transistor connected between the power line and the third logic transistor,
wherein the power line is connected to one of the fourth source and the fourth drain,
one of the first source and the first drain is connected to the other of the fourth source and the fourth drain, using a first shared semiconductor junction,
the fourth gate is configured to receive a power gating control signal, and
one of the third source and the third drain is connected to the second power transistor.

2. The semiconductor device of claim 1, wherein the second power transistor includes a fifth gate, a fifth source and a fifth drain, and
the one of the third source and the third drain is connected one of the fifth source and the fifth drain, using a second shared semiconductor junction.

3. The semiconductor device of claim 1, wherein the other of the first source and the first drain is connected one of the second source and the second drain.

4. The semiconductor device of claim 3, wherein the other of the second source and the second drain is connected one of the other of the third source and the third drain.

5. The semiconductor device of claim 1, wherein the first power transistor and the second power transistor are connected in parallel with respect to the power line.

6. The semiconductor device of claim 1, wherein the first logic transistor, the second logic transistor and the third logic transistor are connected in series.

7. The semiconductor device of claim 1, wherein the first power transistor is a P-channel metal-oxide semiconductor (PMOS) transistor, and
the second power transistor is an N-channel metal-oxide semiconductor (NMOS) transistor.

8. The semiconductor device of claim 1, wherein the power line includes a metal line, a via, and a contact to provide the power supply voltage.

9. The semiconductor device of claim 1, wherein at least a part of the one of the first source and the first drain is placed in common with at least a part of the other of the fourth source and the fourth drain.

10. A semiconductor memory device comprising:
a first power line configured to provide a first power supply voltage;
a second power line configured to provide a second power supply voltage;
a plurality of word lines extending in a first direction;
a plurality of bit line pairs extending in a second direction crossing the first direction;
a row decoder configured to select one of the plurality of word lines in response to an input row address signal;
a plurality of bit cells configured to store data, each of the plurality of bit cells being connected to one of the plurality of word lines and one of the plurality of bit line pairs;
an input/output (I/O) circuit including a first logic transistor, a second logic transistor, a first power transistor and a second power transistor, configured to receive the second power supply voltage and configured to generate output data; and
a power circuit configured to receive the first power supply voltage, and configured to cut off the second power supply voltage based on a power gating control signal,
wherein the first logic transistor is connected to the first power transistor using a first shared semiconductor junction, and
the second logic transistor is connected to the second power transistor using a second shared semiconductor junction.

11. The semiconductor memory device of claim 10, wherein the first logic transistor includes a first gate, a first source and a first drain,
the second logic transistor includes a second gate, a second source and a second drain,
the first power transistor is connected between the first power line and the first logic transistor, the first power transistor including a third gate, a third source and a third drain, and
the second power transistor is connected between the first power line and the second logic transistor.

12. The semiconductor memory device of claim 11, wherein the first power line is connected to one of the third source and the third drain,
one of the first source and the first drain is connected to the other of the third source and the third drain, using the first shared semiconductor junction,
the third gate is configured to receive the power gating control signal, and
one of the second source and the second drain is connected to the second power transistor.

13. The semiconductor memory device of claim 12, wherein the second power transistor includes a fourth gate, a fourth source and a fourth drain, and
the one of the second source and the second drain is connected one of the fourth source and the fourth drain, using the second shared semiconductor junction.

14. The semiconductor memory device of claim 10, wherein the first power transistor and the second power transistor are connected in parallel with respect to the first power line.

15. The semiconductor device of claim 10, wherein the first power transistor is a P-channel metal-oxide semiconductor (PMOS) transistor, and
the second power transistor is an N-channel metal-oxide semiconductor (NMOS) transistor.

16. A semiconductor device comprising:
a substrate;
an active region formed in the substrate;
a first source/drain, a second source/drain and a third source/drain formed in the active region;
a first gate formed between the first source/drain and the second source/drain; and
a second gate formed between the second source/drain and the third source/drain,
wherein the first gate, the first source/drain and the second source/drain form a first power transistor,
the second gate, the second source/drain and the third source/drain form a first logic transistor included in a precharge circuit, and
a power line is connected to the first source/drain,
wherein the second source/drain is formed in common for the first power transistor and for the first logic transistor, using a shared semiconductor junction, and
a fifth source/drain is formed in common for a second power transistor and for a third logic transistor, using the shared semiconductor junction.

17. The semiconductor device of claim 16, wherein a ratio of width to length of the first source/drain is different from a ratio of width to length of the third source/drain.

18. The semiconductor device of claim 17, wherein the ratio of width to length of the first source/drain is at least two times of the ratio of width to length of the third source/drain.

19. The semiconductor device of claim 16, further comprising:
a fourth source/drain, the fifth source/drain and a sixth source/drain formed in the active region;
a third gate formed between the third source/drain and the fourth source/drain;
a fourth gate formed between the fourth source/drain and the fifth source/drain; and
a fifth gate formed between the fifth source/drain and the sixth source/drain,
wherein the third gate, the third source/drain and the fourth source/drain form a second logic transistor,
the fourth gate, the fourth source/drain and the fifth source/drain form the third logic transistor,
the fifth gate, the fifth source/drain and the sixth source/drain form the second power transistor,
a ratio of width to length of the fourth source/drain is different from a ratio of width to length of the sixth source/drain, and
the power line is connected to the sixth source/drain.

20. The semiconductor device of claim 16, wherein the second source/drain is formed in common for the first power transistor and for the first logic transistor, using a shared semiconductor junction, and
the fifth source/drain is formed in common for the second power transistor and for the third logic transistor, using a shared semiconductor junction.

* * * * *